(12) United States Patent
Yu et al.

(10) Patent No.: US 6,833,588 B2
(45) Date of Patent: Dec. 21, 2004

(54) SEMICONDUCTOR DEVICE HAVING A U-SHAPED GATE STRUCTURE

(75) Inventors: Bin Yu, Cupertino, CA (US); Shibly S. Ahmed, San Jose, CA (US); Judy Xilin An, San Jose, CA (US); Srikanteswara Dakshina-Murthy, Austin, TX (US); Zoran Krivokapic, Santa Clara, CA (US); Haihong Wang, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/274,867

(22) Filed: Oct. 22, 2002

(65) Prior Publication Data

US 2004/0075121 A1 Apr. 22, 2004

(51) Int. Cl.$^7$ .............................................. H01L 27/01
(52) U.S. Cl. ...................... 257/347; 257/401; 257/616; 257/365
(58) Field of Search ................................. 257/347, 401, 257/616, 365

(56) References Cited

U.S. PATENT DOCUMENTS

| | | | |
|---|---|---|---|
| 5,349,228 A | 9/1994 | Neudeck et al. ............ | 257/365 |
| 5,801,397 A | 9/1998 | Cunningham ................ | 257/66 |
| 6,605,847 B2 * | 8/2003 | Kim et al. ................... | 257/401 |
| 2003/0042542 A1 * | 3/2003 | Maegawa et al. ........... | 257/347 |

FOREIGN PATENT DOCUMENTS

JP 2002-43581 2/2002

OTHER PUBLICATIONS

Digh Hisamoto et al., "FinFET–A Self–Aligned Double–Gate MOSFET Scalable to 20 nm," IEEE Transactions on Electron Devices, vol. 47, No. 12, Dec. 2000, pp. 2320–2325.
Yang–Kyu Choi et al., "Sub–20nm CMOS FinFET Technologies," 2001 IEEE, IEDM, pp. 421–424.
Xuejue Huang et al., "Sub–50 nm P–Channel FinFET," IEEE Transactions on Electron Devices, vol. 48, No. 5, May 2001, pp. 880–886.
Xuejue Huang et al., "Sub 50–nm FinFET: PMOS," 1999 IEEE, IEDM, pp. 67–70.
Yang–Kyu Choi et al., "Nanoscale CMOS Spacer FinFET for the Terabit Era," IEEE Electron Device Letters, vol. 23, No. 1, Jan. 2002, pp. 25–27.

* cited by examiner

*Primary Examiner*—Mark V. Prenty
(74) *Attorney, Agent, or Firm*—Harrity & Snyder, LLP

(57) ABSTRACT

A double-gate semiconductor device includes a substrate, an insulating layer, a fin and a gate. The insulating layer is formed on the substrate and the gate is formed on the insulating layer. The fin has a number of side surfaces, a top surface and a bottom surface. The bottom surface and at least a portion of the side surfaces of the fin are surrounded by the gate. The gate material surrounding the fin has a U-shaped cross-section at a channel region of the semiconductor device.

14 Claims, 10 Drawing Sheets

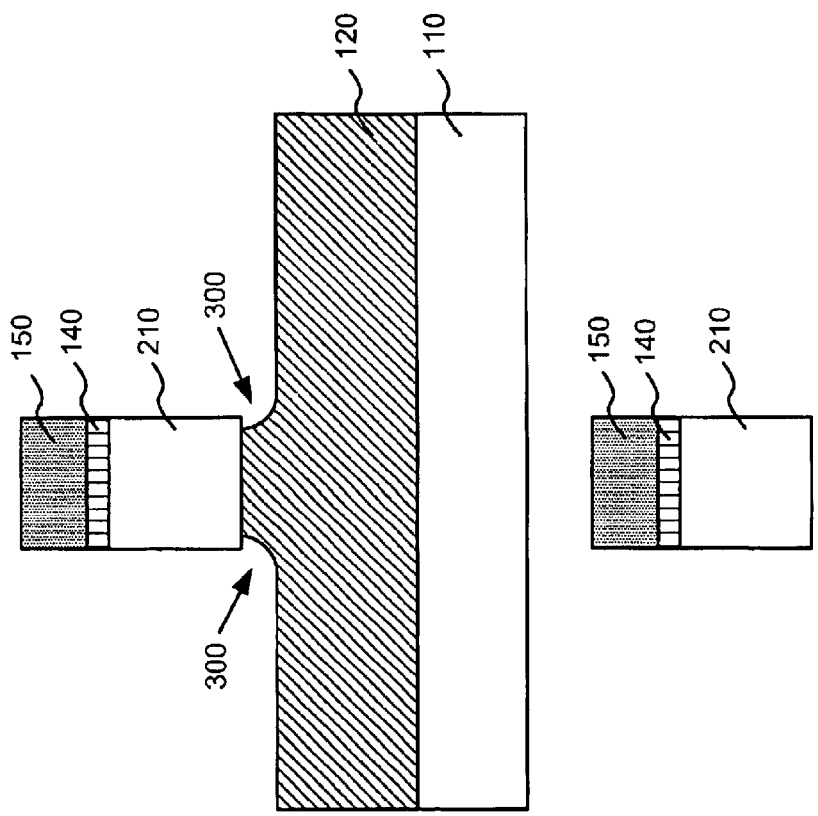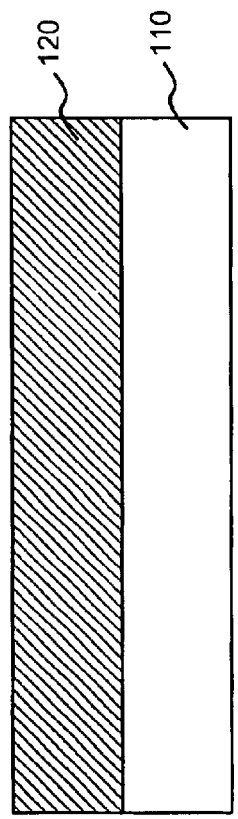

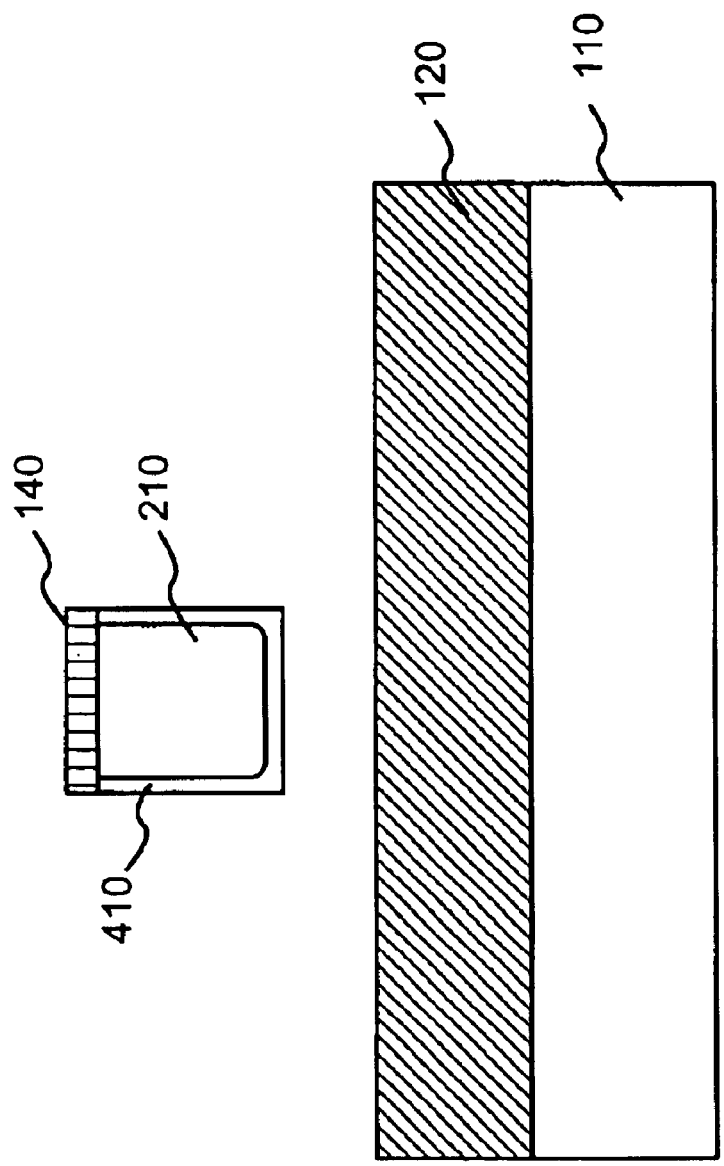

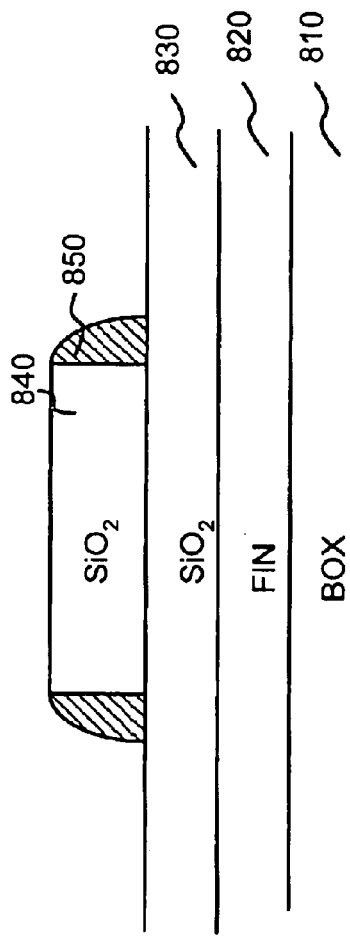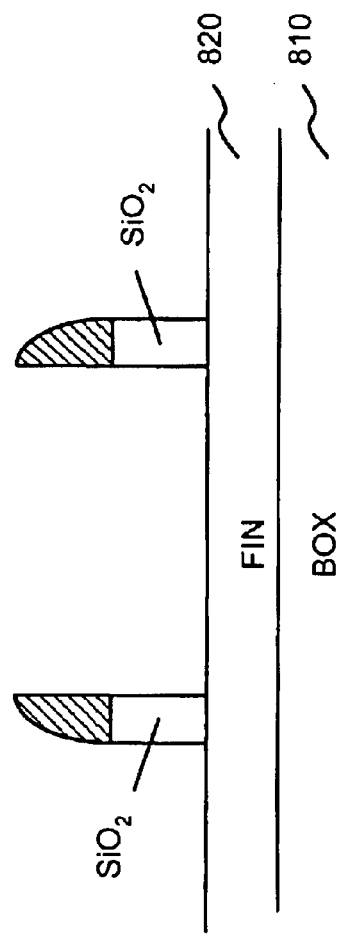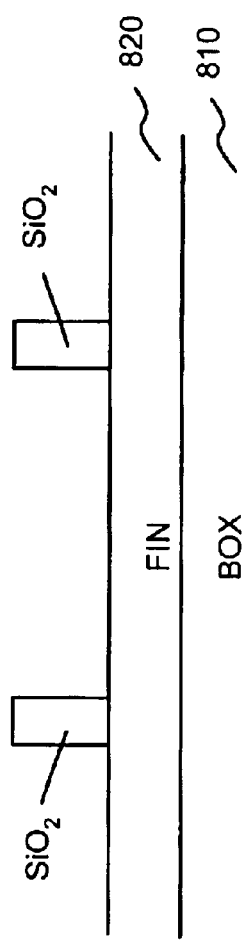

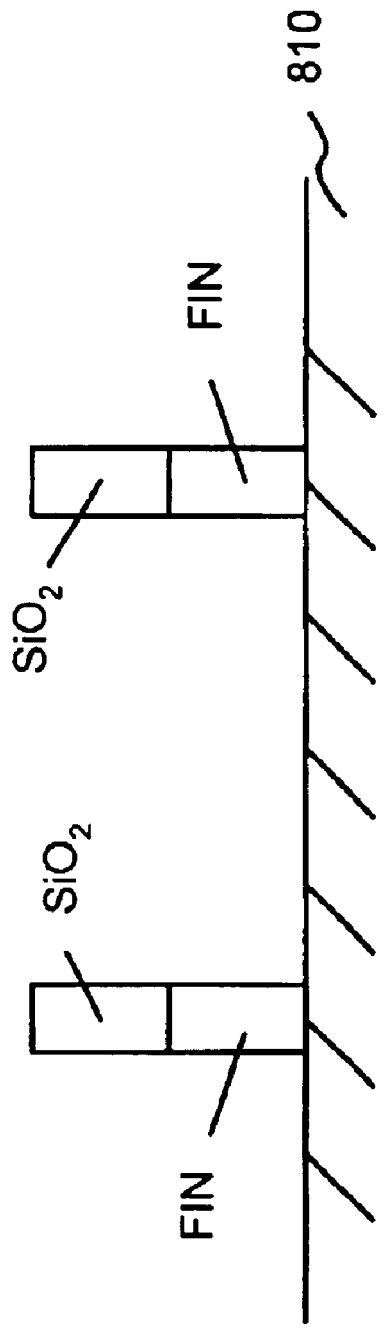
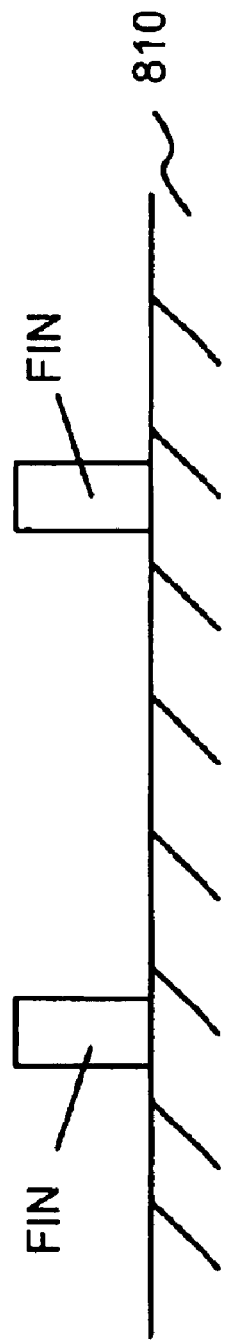

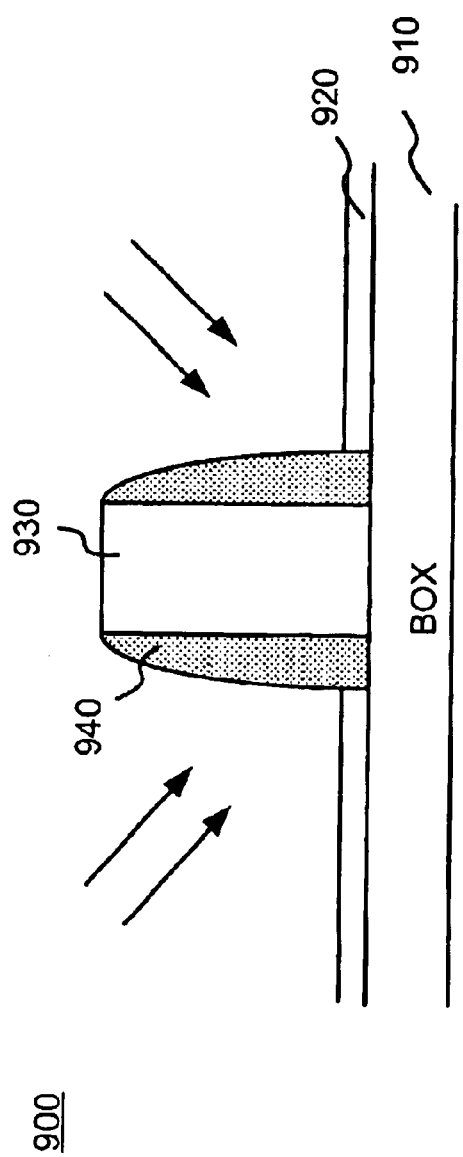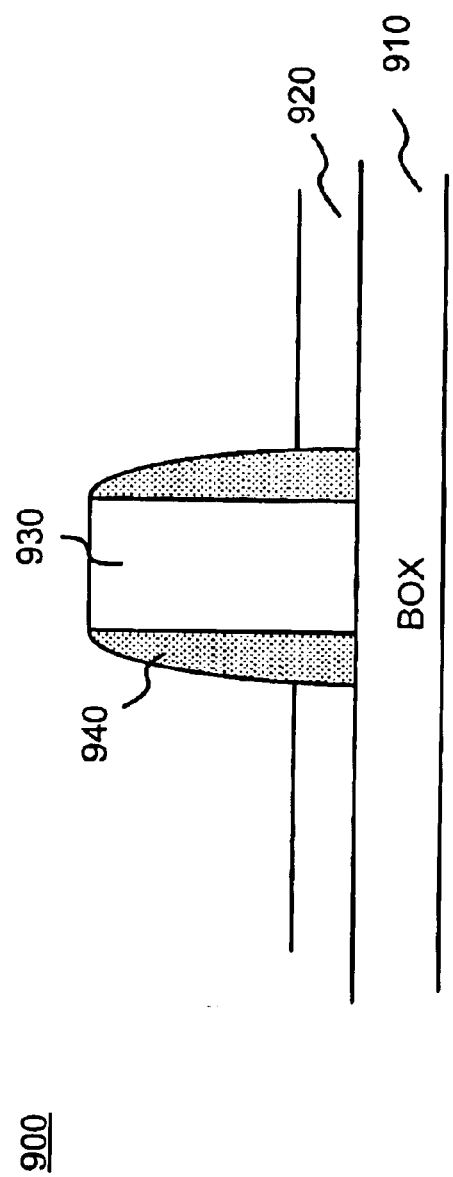

SEMICONDUCTOR DEVICE HAVING A U-SHAPED GATE STRUCTURE

TECHNICAL FIELD

The present invention relates to semiconductor devices and methods of manufacturing semiconductor devices. The present invention has particular applicability to double-gate devices.

BACKGROUND ART

The escalating requirements for high density and performance associated with ultra large scale integration semiconductor devices require design features, such as gate lengths, below 100 nanometers (nm), high reliability and increased manufacturing throughput. The reduction of design features below 100 nm challenges the limitations of conventional methodology.

For example, when the gate length of conventional planar metal oxide semiconductor field effect transistors (MOSFETs) is scaled below 100 nm, problems associated with short channel effects, such as excessive leakage between the source and drain, become increasingly difficult to overcome. In addition, mobility degradation and a number of process issues also make it difficult to scale conventional MOSFETs to include increasingly smaller device features. New device structures are therefore being explored to improve FET performance and allow further device scaling.

Double-gate MOSFETs represent new structures that have been considered as candidates for succeeding existing planar MOSFETs. In double-gate MOSFETs, two gates may be used to control short channel effects. A FinFET is a recent double-gate structure that exhibits good short channel behavior. A FinFET includes a channel formed in a vertical fin. The FinFET structure may be fabricated using layout and process techniques similar to those used for conventional planar MOSFETs.

DISCLOSURE OF THE INVENTION

Implementations consistent with the present invention provide a FinFET device with two gates that are formed on opposite sides of a conductive fin. The device may include gate material below the conductive fin to increase the total channel width for the device.

Additional advantages and other features of the invention will be set forth in part in the description which follows and in part will become apparent to those having ordinary skill in the art upon examination of the following or may be learned from the practice of the invention. The advantages and features of the invention may be realized and obtained as particularly pointed out in the appended claims.

According to the present invention, the foregoing and other advantages are achieved in part by a semiconductor device that includes a substrate, an insulating layer, a first gate and a fin. The insulating layer is formed on the substrate and the first gate is formed on the insulating layer. The first gate has a U-shaped cross-section at a channel region of the semiconductor device. The fin has a number of side surfaces, a top surface and a bottom surface, where the bottom surface and at least a portion of the side surfaces are surrounded by the first gate.

According to another aspect of the invention, a method of manufacturing a semiconductor device is provided. The method includes forming an insulating layer on a substrate and forming a fin structure on the insulating layer. The fin structure has a number of side surfaces, a top surface and a bottom surface. The method also includes forming a dielectric layer over the top surface of the fin structure, forming source and drain regions and etching the insulating layer to laterally undercut the insulating layer below the bottom surface of the fin structure. The method further includes depositing a gate material over the fin structure, where the gate material surrounds the bottom surface of the fin structure and at least a portion of the side surfaces. The method also includes planarizing the deposited gate material, patterning and etching the gate material to form a first and a second gate electrode on opposite sides of the fin.

According to a further aspect of the invention, a semiconductor device that includes a substrate, an insulating layer, a conductive fin, a dielectric cap, a gate dielectric layer and a gate is provided. The insulating layer is formed on the substrate and the conductive fin is formed on the insulating layer. The conductive fin has a first end, a second end and a middle portion located between the first and second ends, where the first and second ends are disposed on the insulating layer and the middle portion is separated from the insulating layer. The dielectric cap is formed over a top surface of the conductive fin and a gate dielectric layer is formed on side surfaces and a bottom surface of the conductive fin. The gate is formed on the insulating layer and the gate surrounds the bottom surface and side surfaces of the middle portion of the conductive fin.

Other advantages and features of the present invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings are to be regarded as illustrative in nature, and not as restrictive.

BRIEF DESCRIPTION OF THE DRAWINGS

Reference is made to the attached drawings, wherein elements having the same reference number designation may represent like elements throughout.

FIGS. 3A and 3B are cross-sections illustrating undercutting of an insulating layer below the fin of FIG. 2A in accordance with an exemplary embodiment of the present invention.

FIG. 4 is a cross-section illustrating the formation of a gate dielectric layer on the fin of FIG. 3B in accordance with an exemplary embodiment of the present invention.

FIGS. 8A–8E are cross-sections illustrating the formation of multiple fins in accordance with another embodiment of the present invention.

FIGS. 9A and 9B are cross-sections illustrating the formation of raised source/drain areas in accordance with another embodiment of the present invention.

BEST MODE FOR CARRYING OUT THE INVENTION

The following detailed description of the invention refers to the accompanying drawings. The same reference numbers in different drawings may identify the same or similar elements. Also, the following detailed description does not limit the invention. Instead, the scope of the invention is defined by the appended claims and their equivalents.

Implementations consistent with the present invention provide double gate FinFET devices and methods of manufacturing such devices. The FinFET devices formed in accordance with the present invention may include gates formed on opposite sides of a conductive fin with gate material surrounding a bottom surface of the conductive fin.

Figure 1:
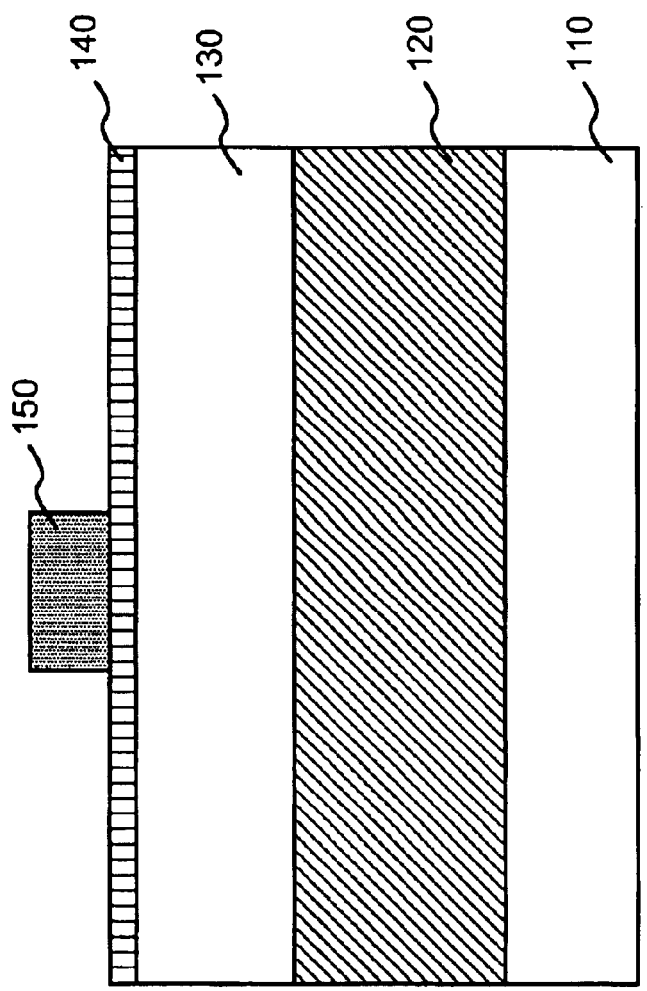
FIG. 1 is a cross-section illustrating exemplary layers that may be used for forming a fin in accordance with an embodiment of the present invention.

FIG. 1 illustrates the cross-section of a semiconductor device 100 formed in accordance with an embodiment of the present invention. Referring to FIG. 1, semiconductor device 100 may include a silicon on insulator (SOI) structure that includes a silicon substrate 110, a buried oxide layer 120 and a silicon layer 130 on the buried oxide layer 120. Buried oxide layer 120 and silicon layer 130 may be formed on substrate 110 in a conventional manner.

In an exemplary implementation, buried oxide layer 120 may include a silicon oxide and may have a thickness ranging from about 1500 Å to about 3000 Å. Silicon layer 130 may include monocrystalline or polycrystalline silicon having a thickness ranging from about 200 Å to about 1000 Å. Silicon layer 130 is used to form a fin structure for a double gate transistor device, as described in more detail below.

In alternative implementations consistent with the present invention, substrate 110 and layer 130 may comprise other semiconducting materials, such as germanium, or combinations of semiconducting materials, such as silicon-germanium. Buried oxide layer 120 may also include other dielectric materials.

A dielectric layer 140, such as a silicon nitride layer or a silicon oxide layer, may be formed over silicon layer 130 to act as a protective cap during subsequent etching processes. In an exemplary implementation, dielectric layer 140 may be deposited at a thickness ranging from about 100 Å to about 250 Å. Next, a photoresist material may be deposited and patterned to form a photoresist mask 150 for subsequent processing. The photoresist may be deposited and patterned in any conventional manner.

Figure 2A:
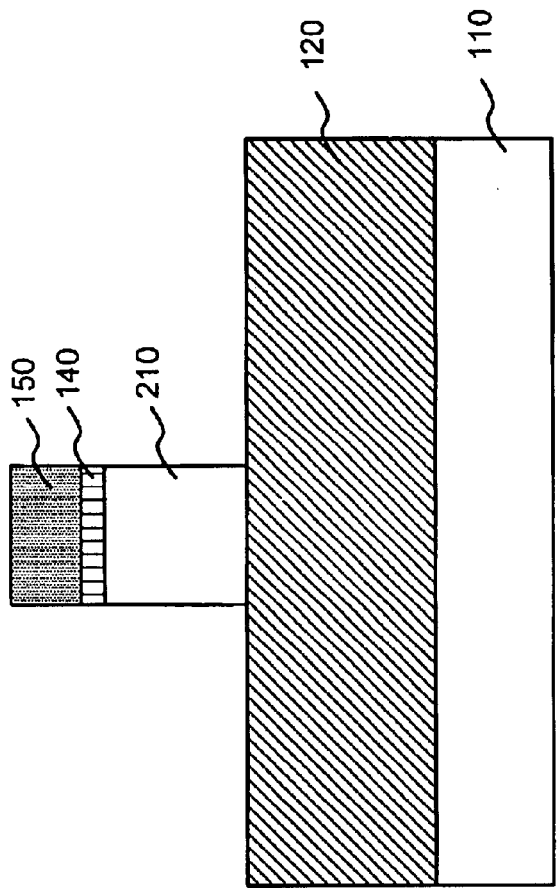
FIG. 2A is a cross-section illustrating the formation of a fin in accordance with an exemplary embodiment of the present invention.

Semiconductor device 100 may then be etched. In an exemplary implementation, silicon layer 130 may be etched in a conventional manner, with the etching terminating on buried oxide layer 120, as illustrated in FIG. 2A. Referring to FIG. 2A, dielectric layer 140 and silicon layer 130 have been etched to form a fin 210 comprising silicon with a dielectric cap 140.

Figure 2B:
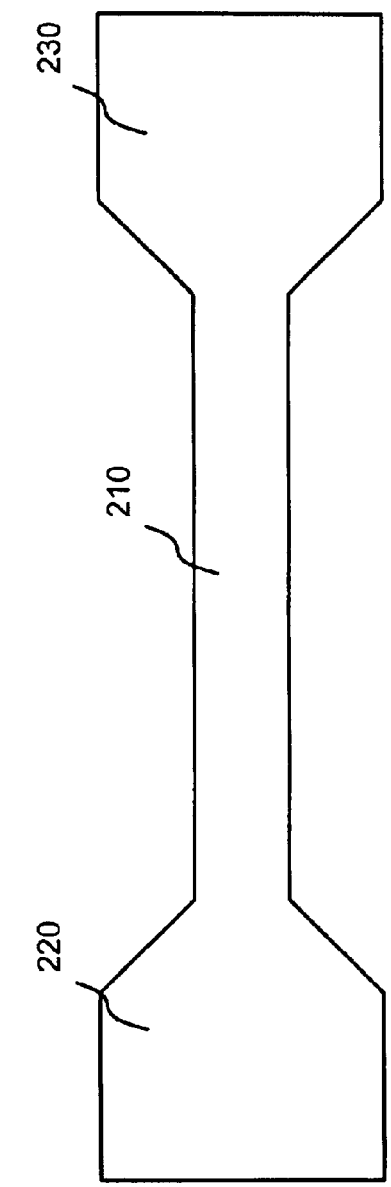
FIG. 2B schematically illustrates the top view of the semiconductor device of FIG. 2A in accordance with an exemplary embodiment of the present invention.

After the formation of fin 210, source and drain regions may be formed adjacent the respective ends of fin 210. For example, in an exemplary embodiment, a layer of silicon, germanium or combination of silicon and germanium may be deposited, patterned and etched in a conventional manner to form source and drain regions. FIG. 2B illustrates a top view of semiconductor 100 including source region 220 and drain region 230 formed adjacent fin 210 on buried oxide layer 120, according to an exemplary embodiment of the present invention.

After the source/drain regions 220 and 230 are formed, the semiconductor device 100 may be etched using a conventional etch chemistry to remove a portion of buried oxide layer 120, as illustrated in FIG. 3A. In an exemplary implementation, the etching may remove about 100 Å to about 250 Å of buried oxide layer 120. During the etching, a portion of the buried oxide layer 120 below fin 210 may be removed, as illustrated at areas 300 in FIG. 3A. This lateral undercut below fin 210 may be used to facilitate subsequent processing to further etch the buried oxide layer 120 below the fin 210.

A second etching may then be performed to laterally etch through the portion of the buried oxide layer 120 below fin 210. In an exemplary implementation, an isotropic etch using, for example, HBr at a high pressure, may be performed to laterally etch through the buried oxide layer 120 located below fin 210, as illustrated in FIG. 3B.

Fin 210 is effectively suspended above buried oxide layer 120 in the cross-section illustrated in FIG. 3B. The end portions of fin 210, however, are still attached to the buried oxide layer 120 and the suspended portion of fin 210 illustrated in FIG. 3B is supported by the buried oxide layer 120 at the ends of fin 210 adjacent source/drain regions 220 and 230, respectively.

The photoresist mask 150 may be removed and a dielectric layer may then be formed on fin 210. For example, a thin oxide film 410 may be thermally grown on fin 210, as illustrated in FIG. 4. The oxide film 410 may be grown to a thickness of about 10 Å to about 30 Å and may be formed on the exposed silicon side surfaces and bottom surface of fin 210 to act as a gate dielectric layer. The dielectric cap 140, however, protects the top surface of fin 210.

Figure 5:
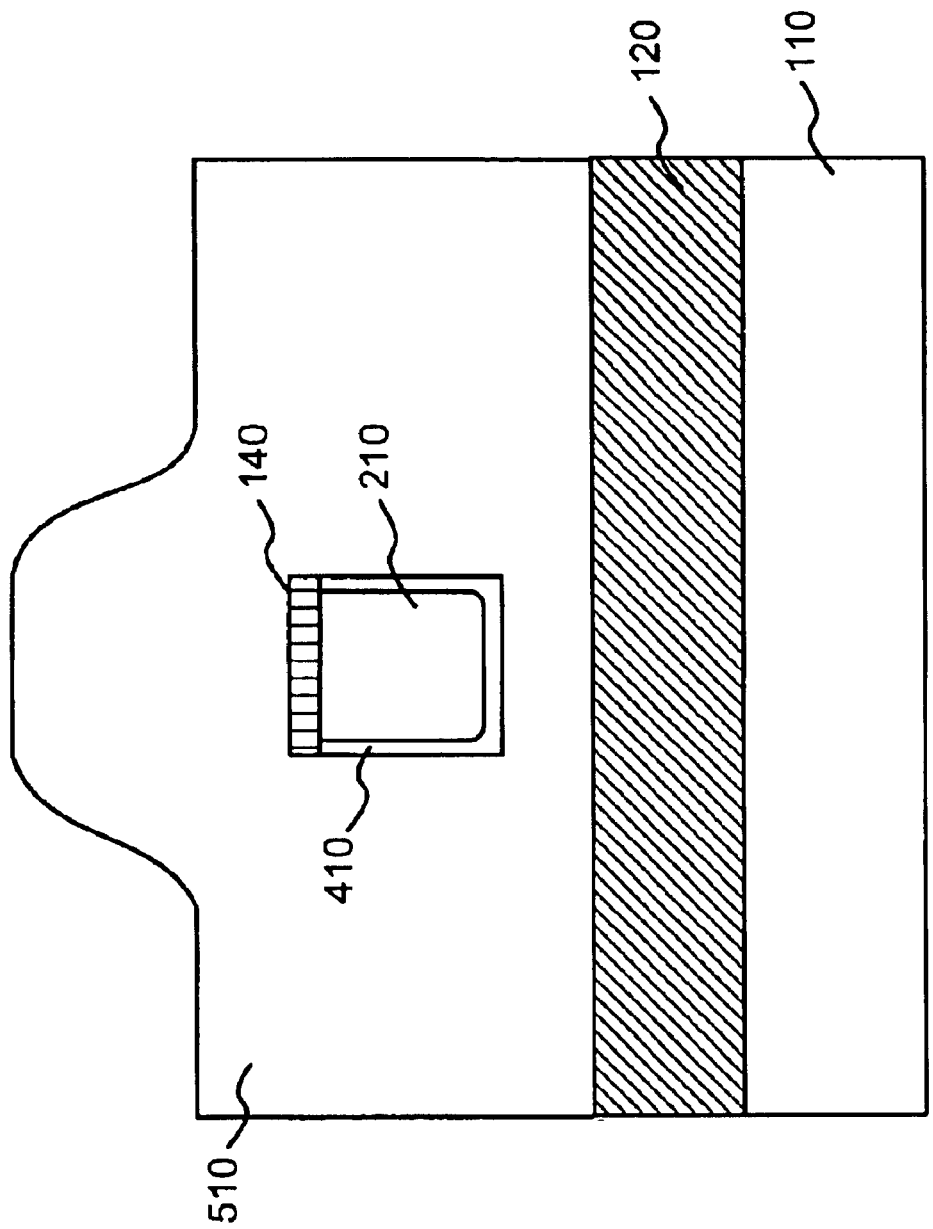
FIG. 5 is a cross-section illustrating the formation of a gate material on the device of FIG. 4 in accordance with an exemplary embodiment of the present invention.

A silicon layer 510 may then be deposited over semiconductor device 100, as illustrated in FIG. 5. The silicon layer 510 may comprise the gate material for the subsequently formed gate electrode. In an exemplary implementation, the silicon layer 510 may include polysilicon deposited using conventional chemical vapor deposition (CVD) to a thickness ranging from about 500 Å to about 1000 Å. Alternatively, other semiconducting materials, such as germanium or combinations of silicon and germanium, or various metals may be used as the gate material.

Figure 6:
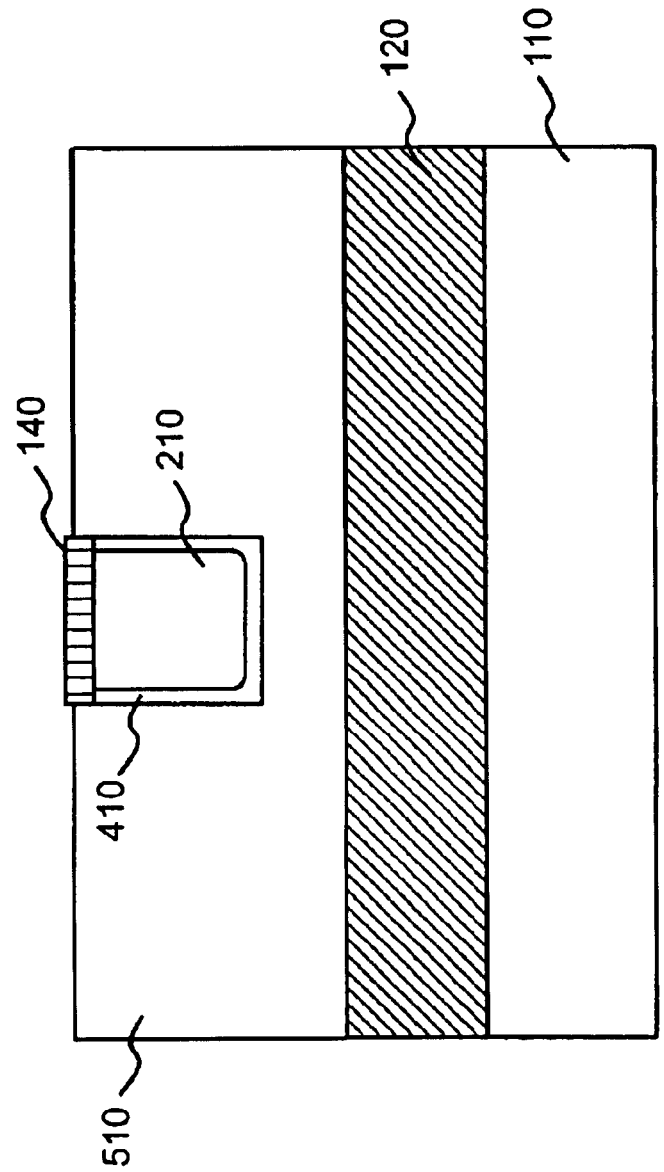
FIG. 6 is a cross-section illustrating the planarizing of the gate material in accordance with an exemplary embodiment of the present invention.

Semiconductor device 100 may then be planarized. For example, a chemical-mechanical polishing (CMP) may be performed so that the gate material (i.e., silicon layer 510) is even with or nearly even with dielectric cap 140 in the vertical direction, as illustrated in FIG. 6. Referring to FIG. 6, the cross-section of silicon layer 510 in the channel region of semiconductor device 100 is U-shaped and the gate material surrounds fin 210 on the two side surfaces and the bottom surface of fin 210 in the channel region. The top surface of fin 210, however, is covered by dielectric cap 140.

Figure 7:
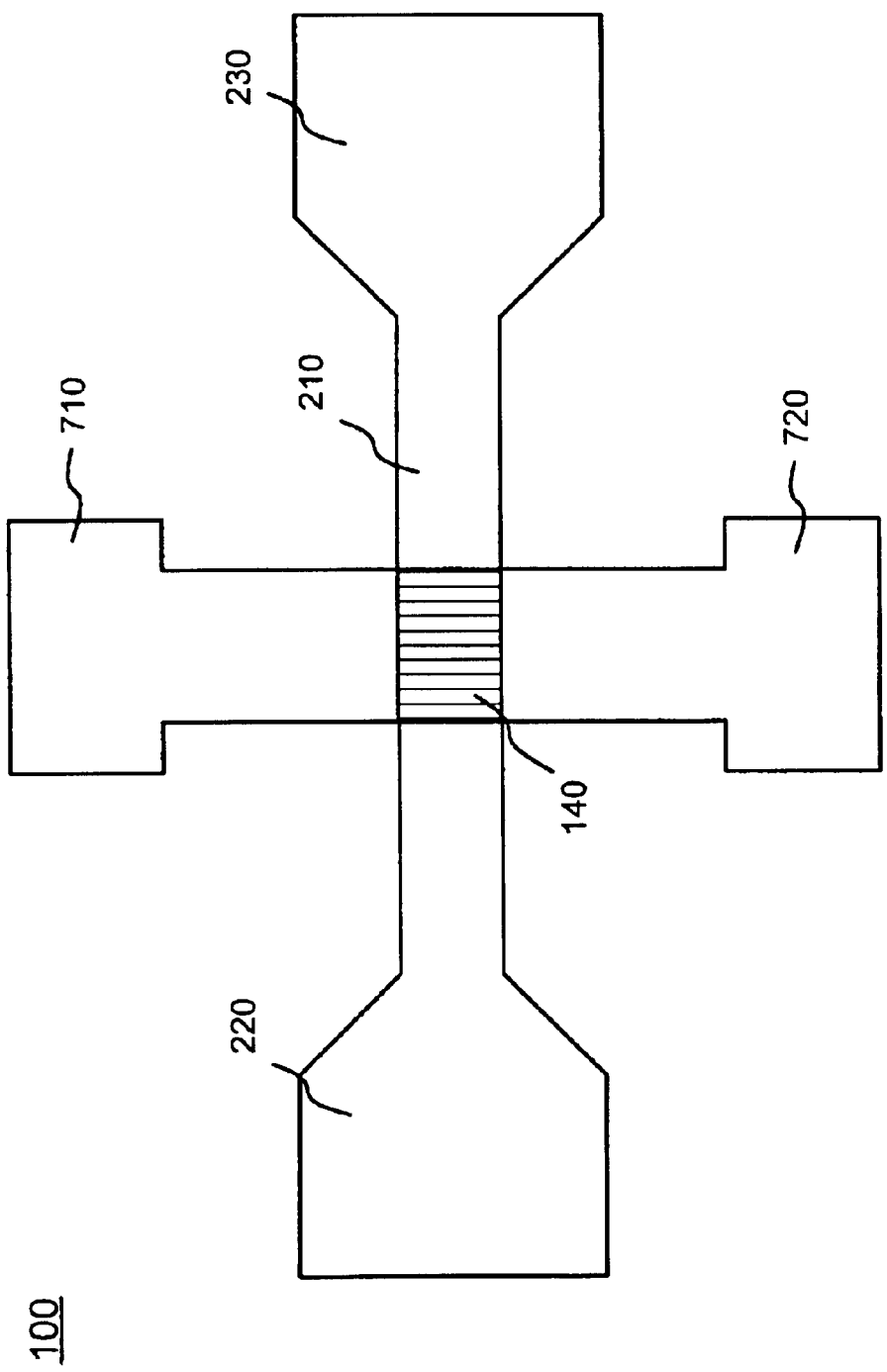
FIG. 7 is a top view illustrating an exemplary double gate device formed in accordance with an exemplary embodiment of the present invention.

The silicon layer 510 may then be patterned and etched to form the gate electrodes. For example, FIG. 7 illustrates a top view of semiconductor device 100 consistent with the present invention after the gate electrodes are formed. As illustrated, semiconductor device 100 includes a double gate structure with gate electrodes 710 and 720 and gate material 510 (FIG. 6) surrounding the bottom portion of fin 210. The gate dielectric 410 surrounding the side surfaces and bottom surface of fin 210 is not shown in FIG. 7 for simplicity.

The source/drain regions 220 and 230 may then be doped. For example, n-type or p-type impurities may be implanted in source/drain regions 220 and 230. The particular implantation dosages and energies may be selected based on the particular end device requirements. One or ordinary skill in this art would be able to optimize the source/drain implantation process based on the circuit requirements and such steps are not disclosed herein in order not to unduly obscure the thrust of the present invention. In addition, sidewall spacers may optionally be formed prior to the source/drain ion implantation to control the location of the source/drain junctions based on the particular circuit requirements. Activation annealing may then be performed to activate the source/drain regions 220 and 230.

The resulting semiconductor device 100 illustrated in FIG. 7 is a double gate device with a first gate 710 and a second gate 720. The gate material 510 (FIG. 6) surrounds three surfaces of fin 210 and provides semiconductor device 100 with increased channel width per device, as compared to a conventional FinFET, while enabling the fin 210 to maintain the dielectric cap 140 that protects the fin 210 during gate etching. In addition, the gate material 510 that surrounds the bottom portion of fin 210 may be used as a third gate in situations where a third gate electrode may be required.

In some implementations, the process associated with laterally undercutting the buried oxide layer 120, described above with respect to FIGS. 3A and 3B, may be bypassed, resulting in two electrically and physically separated gate electrodes 710 and 720. In this implementation, each of the gate electrodes 710 and 720 may be separately biased when used in a circuit since they are effectively disconnected from each other by the fin. For example, in this implementation, gate electrode 710 may be biased with a different voltage than gate electrode 720 based on the particular circuit requirements. Independently biasing the gates increases the flexibility of semiconductor device 100 during circuit design. In addition, gate electrode 710 may be doped with n-type or p-type impurities independently from gate electrode 720 and vice versa.

Thus, in accordance with the present invention, a double-gate FinFET device is formed with a U-shaped cross-section in the channel region of the device. Advantageously, the resulting structure exhibits good short channel behavior. In addition, the present invention provides increased flexibility and can be easily integrated into conventional processing.

OTHER EMBODIMENTS

In some implementations, a FinFET may require multiple fins. FIGS. 8A–8E illustrate exemplary processing for forming multiple fins. FIG. 8A illustrates the cross-section of a semiconductor device 800. Referring to FIG. 8A, device 800 may include a buried oxide (BOX) layer 810, a fin layer 820, an $SiO_2$ layer 830, $SiO_2$ structure 840 and polysilicon spacers 850. Fin layer 820 may include silicon, germanium or a combination of silicon and germanium. Layers 810–830, structure 840 and spacers 850 may be formed in a conventional manner. $SiO_2$ structure 840 and spacers 850 may be formed to have a predetermined width based on the desired distance between the fins that are to be formed.

$SiO_2$ structure 840 and layer 830 may then be etched, resulting in the structure illustrated in FIG. 8B. As illustrated, the poly spacers 850 protect the underlying $SiO_2$ from being etched. Poly spacers 850 may then be removed, as illustrated in FIG. 8C. Fin layer 820 may then be etched in a conventional manner, with the $SiO_2$ acting as a mask to protect the fin material below the $SiO_2$, as illustrated in FIG. 8D. The $SiO_2$ mask may then be etched, with the etching terminating on the silicon fin material, resulting in the two fins illustrated in FIG. 8E. In this manner, two or more fins be formed a predetermined distance apart from each other.

In other implementations, a FinFET with a raised source/drain may be desired. FIGS. 9A and 9B are cross-sections illustrating exemplary processing for forming a FinFET with raised source/drain regions. Referring to FIG. 9A, device 900 includes a BOX layer 910, silicon layer 920, gate 930 and sidewall spacers 940. These layers/structures may be formed in a conventional manner. The silicon layer 920 may be etched back in the source/drain regions such that approximately 10% of the silicon remains. Next, a tilted source/drain implantation may be performed to dope the source/drain regions, as illustrated by the arrows in FIG. 9A. The source/drain ion implantation may include n-type or p-type impurities based on the particular circuit requirements.

After the source/drain implantation has been completed, a selective epitaxial growth (SEG) of silicon layer 920 may be performed to raise the height of the source/drain regions, as illustrated in FIG. 9B. In this manner, the source/drain implants may be implanted to form S/D junctions at the desired location followed by an SEG process that raises the source/drain regions. In this manner, the resulting device may exhibit reduced parasitic source/drain resistance.

In the previous descriptions, numerous specific details are set forth, such as specific materials, structures, chemicals, processes, etc., in order to provide a thorough understanding of the present invention. However, the present invention can be practiced without resorting to the specific details set forth herein. In other instances, well known processing structures have not been described in detail, in order not to unnecessarily obscure the thrust of the present invention.

The dielectric and conductive layers used in manufacturing a semiconductor device in accordance with the present invention can be deposited by conventional deposition techniques. For example, metallization techniques, such as various types of CVD processes, including low pressure CVD (LPCVD) and enhanced CVD (ECVD) can be employed.

The present invention is applicable in the manufacturing of double-gate semiconductor devices and particularly in FinFET devices with design features of 100 nm and below. The present invention is applicable to the formation of any of various types of semiconductor devices, and hence, details have not been set forth in order to avoid obscuring the thrust of the present invention. In practicing the present invention, conventional photolithographic and etching techniques are employed and, hence, the details of such techniques have not been set forth herein in detail.

Only the preferred embodiments of the invention and a few examples of its versatility are shown and described in the present disclosure. It is to be understood that the invention is capable of use in various other combinations and environments and is capable of modifications within the scope of the inventive concept as expressed herein.

What is claimed is:

1. A semiconductor device, comprising:

a substrate;

an insulating layer formed on the substrate;

a first gate formed on the insulating layer, the first gate having a U-shaped cross-section at a channel region of the semiconductor device; and a fin having a plurality of side surfaces, a top surface and a bottom surface, wherein the bottom surface and at least a portion of the side surfaces are surrounded by the first gate.

2. The semiconductor device of claim 1, wherein the first gate comprises:

a first gate electrode located at a first side of the fin, and a second gate electrode located at an opposite side of the fin from the first gate electrode.

3. The semiconductor device of claim 2, wherein the first gate comprises at least one of silicon and germanium.

4. The semiconductor device of claim 2, wherein a portion of the first gate surrounding the bottom surface of the fin comprises a third gate electrode.

5. The semiconductor device of claim 1, further comprising:

a dielectric layer formed around the plurality of side surfaces and the bottom surface of the fin.

6. The semiconductor device of claim 1, wherein both the first gate and the substrate comprise at least one of silicon and germanium.

7. The semiconductor device of claim 6, wherein the insulating layer comprises a buried oxide layer.

8. The semiconductor device of claim 1, wherein the fin comprises at least one of silicon and germanium.

9. The semiconductor device of claim 1, further comprising:

a source region and a drain region formed above the insulating layer and adjacent a respective first and second end of the fin.

10. The semiconductor device of claim 1, further comprising:

a dielectric layer comprising at least one of a nitride and an oxide formed over the top surface of the fin.

11. A semiconductor device, comprising:

a substrate;

an insulating layer form on the substrate;

a conductive fin formed on the insulating layer, the conductive fin having a first end, a second end and a middle portion located between the first and second ends, wherein the first and second end are disposed on the insulating layer and the middle portion is separated from the insulating layer;

a dielectric cap formed over a top surface of the conductive fin;

a gate dielectric layer formed on side surfaces and a bottom surface of the conductive fin; and a gate formed on the insulating layer, the gate surrounding the bottom surface and side surfaces of the middle portion of the conductive fin and not being formed over the dielectric cap formed over the top surface of the conductive fin.

12. A semiconductor device, comprising:

a substrate;

an insulating layer formed on the substrate;

a conductive fin formed on the insulating layer, the conductive fin having a first end, a second end and a middle portion located between the first and second ends, wherein the first and second ends are disposed on the insulating layer and the middle portion is separated from the insulating layer;

a gate dielectric layer formed on side surfaces and a bottom surface of the conductive fin; and a gate formed on the insulating layer, the gate surrounding the bottom surface and side surfaces of the middle portion of the conductive fin, wherein the gate has a substantially U-shaped cross-section at a channel region of the semiconductor device.

13. The semiconductor device of claim 12, wherein the gate comprises a first gate electrode disposed on a first side of the conductive fin and a second gate electrode disposed on an opposite side of the conductive fin.

14. The semiconductor device of claim 11, wherein the gate comprises a first gate electrode disposed on a first side of the conductive fin, a second gate electrode disposed on an opposite side of the conductive fin and a third gate electrode disposed on a bottom side of the conductive fin.

* * * * *